United States Patent
Kalnitsky et al.

(10) Patent No.: US 6,855,585 B1
(45) Date of Patent: Feb. 15, 2005

(54) INTEGRATING MULTIPLE THIN FILM RESISTORS

(75) Inventors: Alexander Kalnitsky, Portland, OR (US); Joseph Paul Elull, San Jose, CA (US); Ralph Wall, Beaverton, OR (US); Robert F. Scheer, Portland, OR (US); Jonathan Herman, San Jose, CA (US); Glenn Nobinger, Santa Clara, CA (US); Viktor Zekeriya, Atherton, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 318 days.

(21) Appl. No.: 10/002,429

(22) Filed: Oct. 31, 2001

(51) Int. Cl.[7] .......................................... H01L 21/302
(52) U.S. Cl. .................. 438/171; 438/330; 438/697; 438/700
(58) Field of Search ................. 438/171, 330, 438/697, 700, 693, 714, 740, 745

(56) References Cited

U.S. PATENT DOCUMENTS 6,365,498 B1 * 4/2002 Chu et al. .................... 438/612
6,678,127 B2 * 1/2004 Hsiao et al. ................. 360/323

* cited by examiner

*Primary Examiner*—George A. Goudreau
(74) *Attorney, Agent, or Firm*—Blakely, Sokoloff, Taylor & Zafman LLP

(57) ABSTRACT

A method for forming multiple resistors on a substrate. The method initially includes providing a first resistor on the substrate. A first dielectric layer is deposited, patterned, and selectively etched over the first resistor. Second resistor material is provided over the first dielectric layer. Furthermore, landing pad material is provided over the second resistor material. The landing pad material and the second resistor material are then selectively etched. The selective etching forms contacts for the first resistor in a first region, and forms a second resistor and associated contacts in a second region.

16 Claims, 10 Drawing Sheets

INTEGRATING MULTIPLE THIN FILM RESISTORS

BACKGROUND

The present invention relates to thin film resistors. More particularly, the present invention relates to integration of a plurality of such thin film resistors.

Thin film resistors are often used in integrated circuits to implement the desired functionality of the circuit, including biasing of active devices, serving as voltage dividers, and assisting in impedance matching. These thin film resistors may be formed by deposition of resistive material on a dielectric layer, and subsequently patterned to desired size and shape. Often, a thin film resistor is subjected to a heat treatment process (i.e. annealing) to improve its stability and to bring the resistance to a desired value.

Generally, after all the thin film resistors and other components of an integrated circuit are formed, a dielectric layer is deposited to insulate the resistors and other components from the interconnect wiring. This dielectric layer may be subjected to planarization by chemical-mechanical polishing (CMP) if reduced topography is desired before forming the interconnect wiring. Once the dielectric layer is formed, contacts are made through the layer to make electrical connections to thin film resistors and other components of the integrated circuit.

Problems with simultaneously forming contacts to thin film resistors and active components built into the silicon substrate include a thickness difference of the dielectric above the thin film resistors and active components. Moreover, long etch times required to open the deepest contact (to the substrate) may result in a large over-etch in shallower contacts (to thin film resistors). This over-etch may etch through or sputter away the thin film material. Accordingly, the thin film resistor contacts may be formed by developing and patterning etch-stops to alleviate the thickness variations. However, the formation of etch-stops, in addition to the contacts, increases the number of masks required. Furthermore, the formation of multiple thin film resistors, along with the associated contacts and etch-stops, may require a large number of masking operations.

SUMMARY

The present invention, in one aspect, describes a method for forming multiple resistors on a substrate. The method initially includes providing a first resistor on the substrate. A first dielectric layer is deposited, patterned, and selectively etched over the first resistor. Second resistor material is provided over the first dielectric layer. Furthermore, landing pad material is provided over the second resistor material. The landing pad material and the second resistor material are then selectively etched. The selective etching forms contacts for the first resistor in a first region, and forms a second resistor and associated contacts in a second region.

In another aspect, the present invention describes an integrated circuit including a plurality of thin film resistors. The integrated circuit includes a plurality of integrated structures, where each structure is successively disposed on top of a previous structure. Each structure includes a first dielectric layer, a first thin film resistor disposed on the first dielectric layer, and a second dielectric layer disposed on the first dielectric layer and the first thin film resistor. The structure also includes a plurality of contacts for the first thin film resistor having at least first and second layers. The contacts are disposed on top edge portions of the first thin film resistor. The first layer includes second thin film resistor material. The second layer includes landing pad material. The structure further includes a second thin film resistor having at least first and second layers. The second thin film resistor is disposed on the second dielectric layer away from the first thin film resistor. The first layer includes second thin film resistor material. The second layer includes landing pad material. Finally, the structure further includes a third dielectric layer deposited on the plurality of contacts for the first thin film resistor, exposed portions of the second thin film resistor, and exposed portions of the second dielectric layer.

DETAILED DESCRIPTION

In recognition of the above-stated challenges associated with prior art designs of forming thin film resistors, the present invention describes embodiments for integrating multiple thin film resistors in a process with a reduced number of masking operations. Hence, the present embodiments provide efficient and cost-effective thin film resistor manufacturing process to enable reduction in the number of masking operations. Consequently, for purposes of illustration and not for purposes of limitation, the exemplary embodiments of the invention are described in a manner consistent with such use, though clearly the invention is not so limited.

Figure 1:
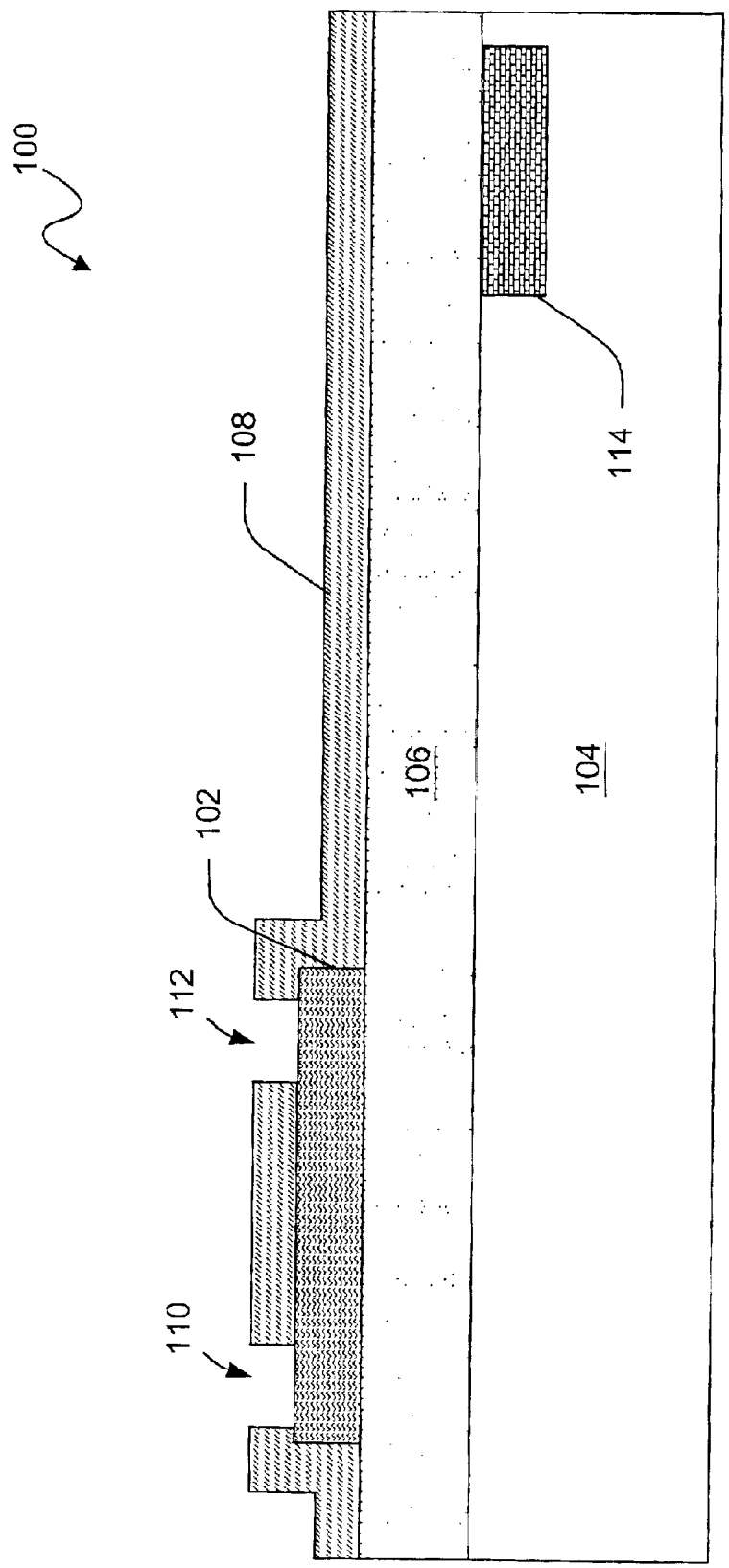
FIGS. 1–4 illustrates cross-sectional views of an exemplary conventional integrated circuit at successive stage of forming a thin film resistor.

A cross-sectional view of an exemplary conventional integrated circuit 100 is illustrated in FIG. 1. The example shows the circuit 100 at an intermediate stage of forming a thin film resistor 102. The integrated circuit 100, at this stage, includes a substrate 104 and a first dielectric layer (e.g., silicon dioxide ($SiO_2$)) 106 disposed on the substrate 104. A layer of thin film resistor material (not fully shown; partly shown as 102) is then formed over the first dielectric layer 106. The thin film resistor material may be comprised of chromium silicon (CrSi), nickel chromium (NiCr), tantalum nitride (TaN), and/or other suitable resistor materials. A first mask layer (not shown) is deposited, developed, and patterned over the thin film resistor material to define and form the underlying thin film resistor 102. The mask layer may be a photo resist or other material that may serve as a mask layer.

A second dielectric layer (e.g., a layer of silicon dioxide ($SiO_2$)) 108 is then formed over the thin film resistor 102 and over the exposed portion of the first dielectric layer 106. Shallow contact openings 110, 112 are formed on the second dielectric layer 108 by patterning, developing, and etching a second mask layer (not shown) on the second dielectric layer 108. The remaining second dielectric layer 108 serves to passivate the thin film resistor 102 at the non-contacted portion of the resistor 102. Other active devices (e.g., 114) may be formed on the substrate 104 by diffusion before the thin film resistor formation.

Figure 2:
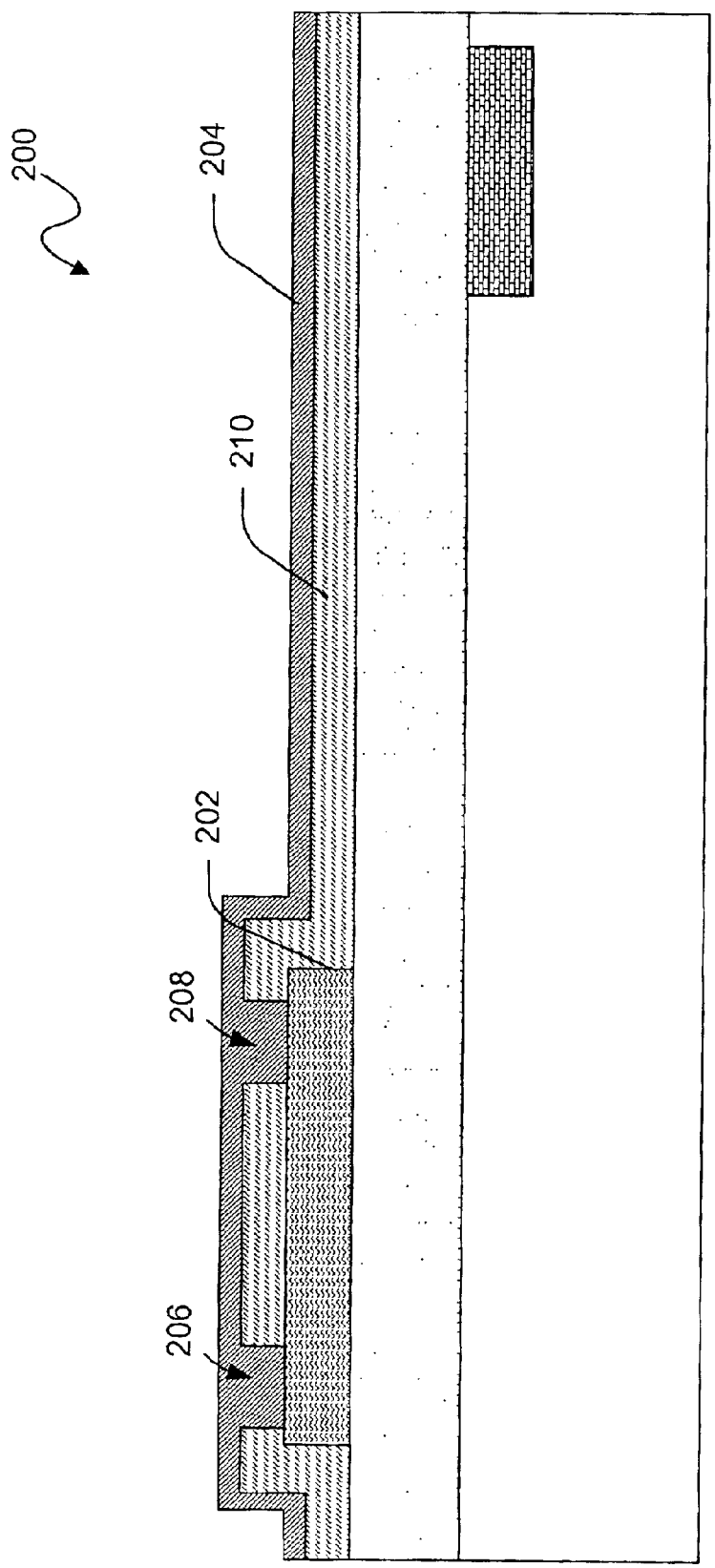

An exemplary conventional integrated circuit 200, at a first subsequent stage of forming a thin film resistor 202, is illustrated in FIG. 2. At this subsequent stage, an etch-stop layer or a landing pad layer 204 is deposited over the portion of the thin film resistor 202 underlying the contact openings 206, 208 and over the remaining second dielectric layer 210. Material for the landing pad layer 204 may be comprised of an electrical conductor, such as titanium-nitride (TiN), titanium-tungsten (TiW), or any other electrically conductive material.

Figure 3:
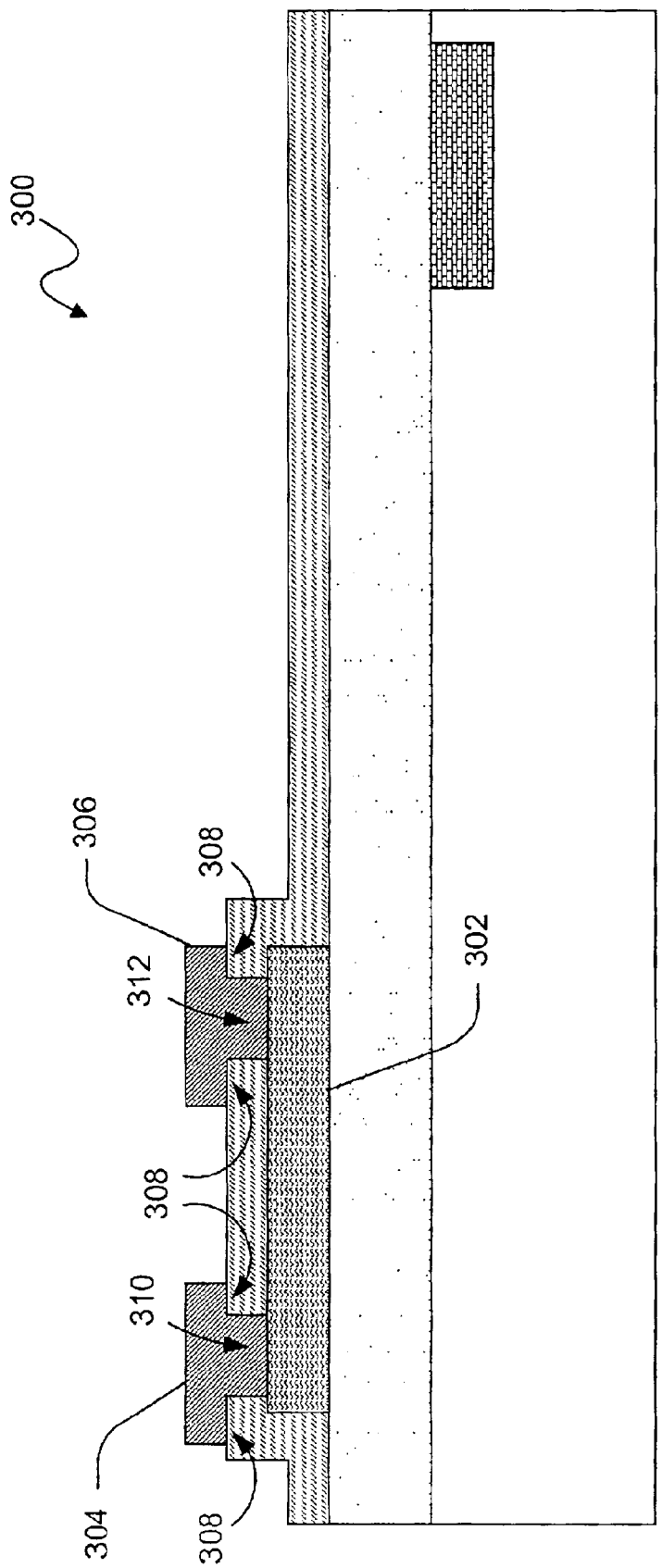

An exemplary conventional integrated circuit 300, at a second subsequent stage of forming a thin film resistor 302, is illustrated in FIG. 3. At this stage, a third mask (not shown) is patterned, developed, and etched over the contact openings 310, 312 in the landing pad layer 204 to form etch-stops 304, 306. The formed etch-stops 304, 306 are disposed on the thin film resistor 302 within the contact openings 310, 312 and also above the region of the second dielectric layer 308 proximate the contact openings 310, 312.

Figure 4:
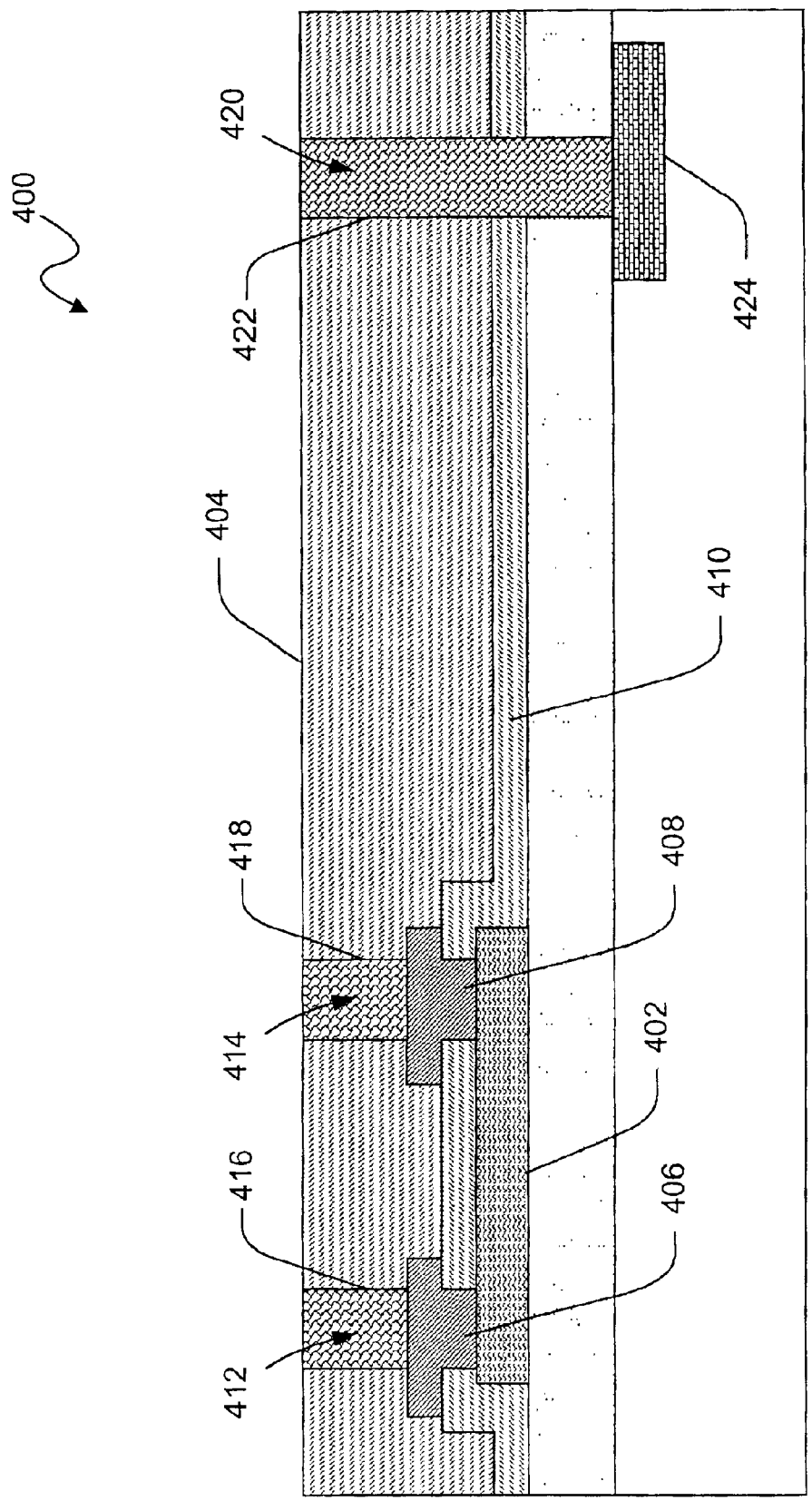

An exemplary conventional integrated circuit 400, at a third subsequent stage of forming a thin film resistor 402, is illustrated in FIG. 4. At this stage, another dielectric layer 404 is deposited over the etch-stops 406, 408 and over the exposed portions of the second dielectric layer 410. After the dielectric layer 404 has been deposited, the layer 404 may be polished to achieve a desired planarization for its top surface and a desired thickness. Contact openings 412, 414 are formed through the dielectric layer 404 to expose the underlying etch-stops 406, 408. Metal plugs 416, 418 are formed within the contact openings 412, 414 of the dielectric layer 404 to provide shallow contacts for the thin film resistor 402. Other openings (e.g., 420) and plugs (e.g., 422) may be formed to provide deep contacts to active devices (e.g., 424).

The above-described method illustrates that the formation of each thin film resistor may require at least three masking operations. The present embodiments, described below, provide for methods to reduce the number of masking operations in the formation of thin film resistors.

FIGS. 5 through 10 illustrate a process for forming two thin film resistors according to embodiments of the present invention. However, the process described below may be extended to form more than two thin film resistors.

Figure 5:
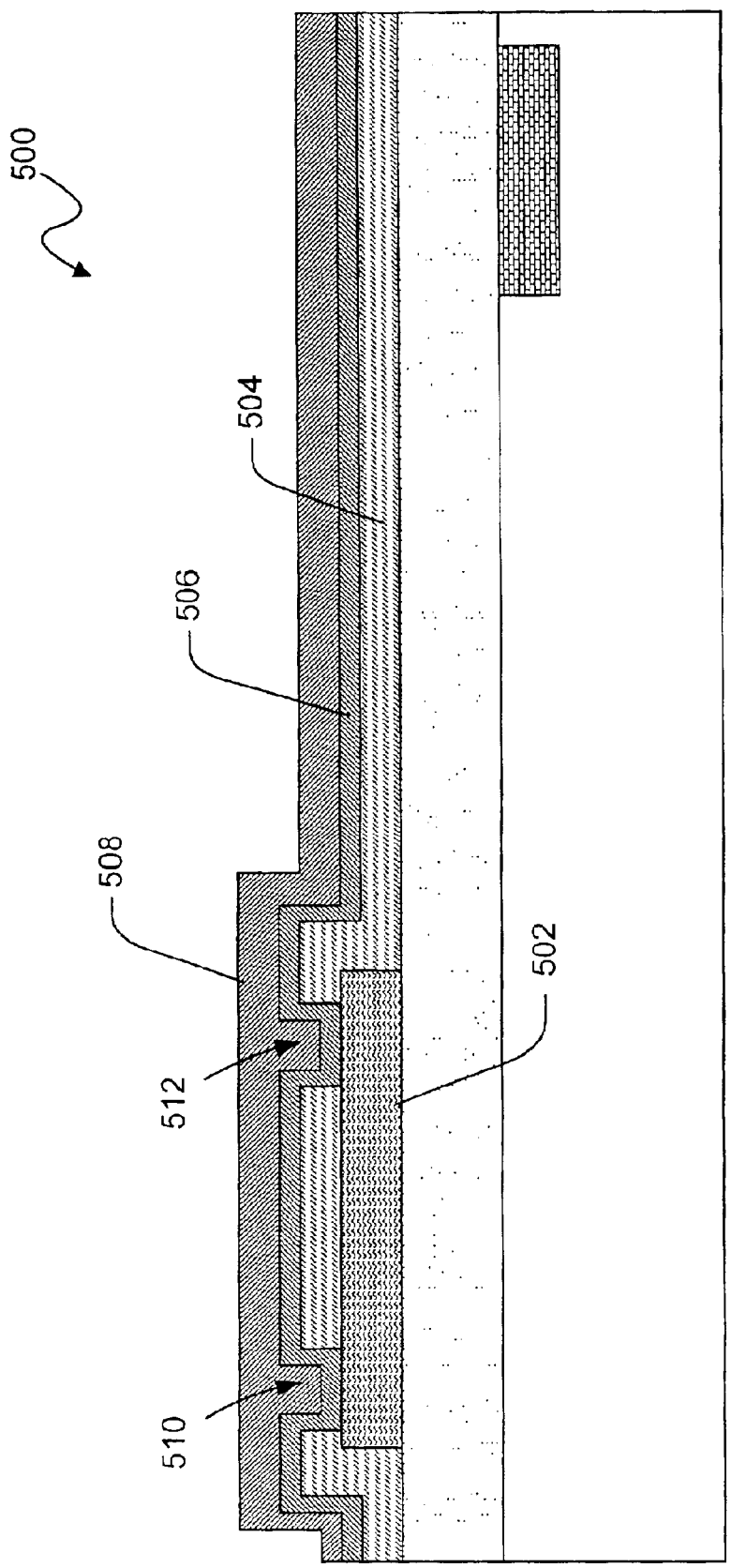
FIG. 5 illustrates a cross-sectional view of an exemplary integrated circuit, at a particular intermediate stage of forming multiple thin film resistors, in accordance with an embodiment of the present invention.

An exemplary integrated circuit 500, at a particular intermediate stage of forming multiple thin film resistors, is illustrated in FIG. 5 according to an embodiment of the present invention. At this particular stage, a first thin film resistor 502 and contact openings 510, 512 are formed, similar to the stage shown in FIG. 1. The first thin film resistor may be comprised of material having chromium silicon (CrSi), nickel chromium (NiCr), tantalum nitride (TaN), and/or other suitable resistor materials. However, instead of depositing the landing pad material directly over the portion of the first thin film resistor 502 underlying the contact openings and over the dielectric layer 504 (i.e., similar to FIG. 2), a second thin film resistor layer 506 may be deposited. This second thin film resistor layer 506 may be comprised of nickel chromium (NiCr) or other suitable resistor materials with the resistivity that is substantially lower than the resistivity of the first thin film resistor material. This is done to maintain low contact resistance to the first thin film resistor.

In the illustrated embodiment of FIG. 5, a second thin film resistor layer 506, comprised of different material than that of the first thin film resistor 502, is deposited over the portion of the first thin film resistor 502 underlying the contact openings and over the dielectric layer 504. The second thin film resistor layer 506 is then capped with a landing pad layer 508. Material for the landing pad layer 508 may be comprised of an electrical conductor, such as titanium-nitride (TiN), titanium-tungsten (TiW), or any other electrically conductive material with high etch selectivity to the NiCr layer.

Figure 6:
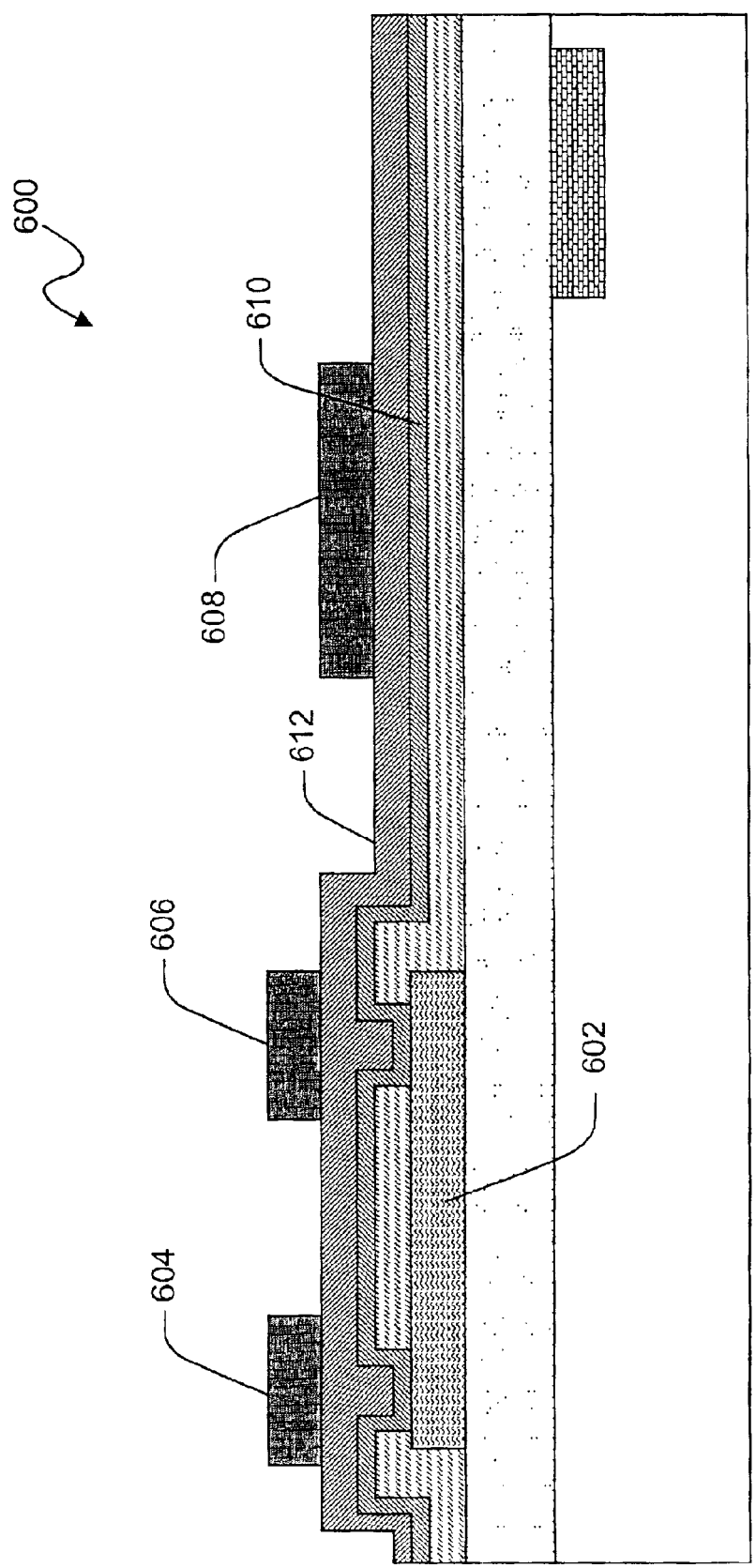
FIGS. 6–10 illustrate cross-sectional views of an exemplary integrated circuit, at subsequent stages of forming multiple thin film resistors, in accordance with embodiments of the present invention.

FIG. 6 illustrates an exemplary integrated circuit 600, at a subsequent stage of forming multiple thin film resistors in accordance with an embodiment of the present invention. At this subsequent stage, masks 604, 606, 608 are patterned over the landing pad material 612 above the first thin film resistor 602. Furthermore, a mask 608 is patterned over an area of the second thin film resistor layer 610 where the second resistor is to be formed.

Figure 7:
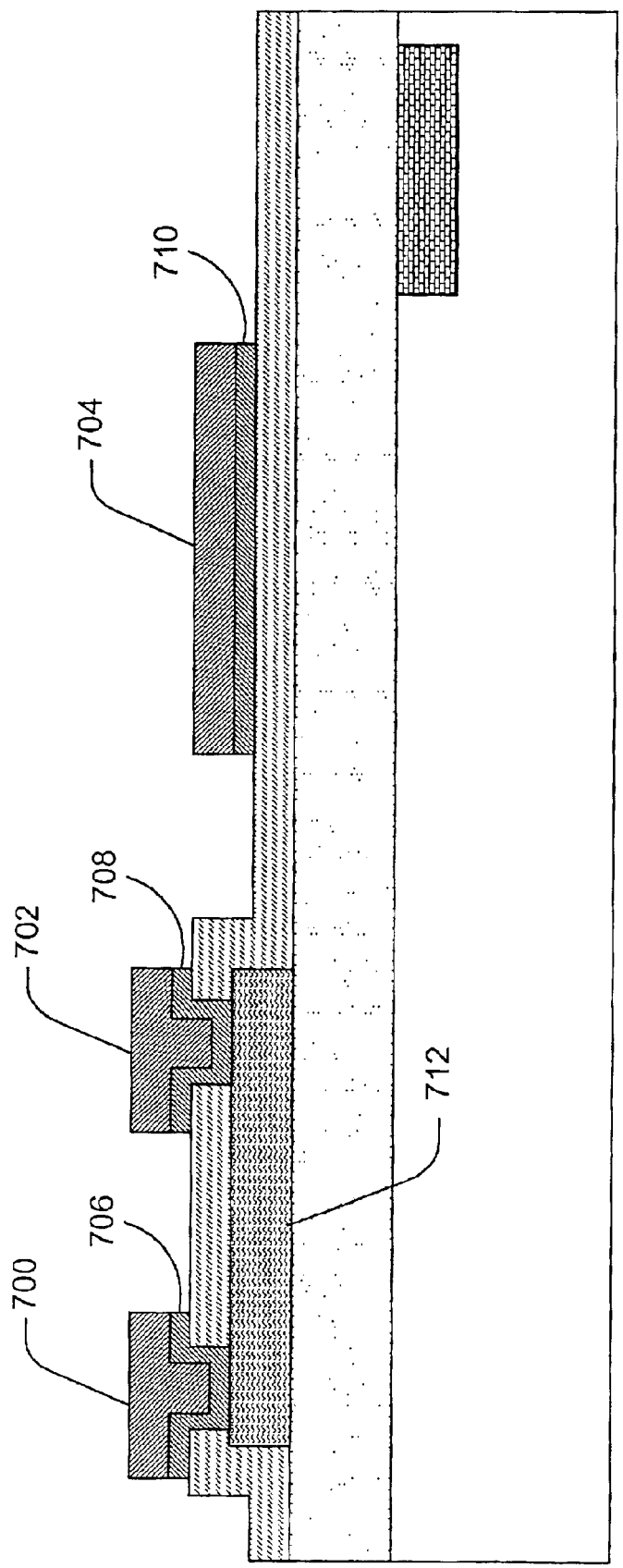

The landing pad material 612 and the second thin film resistor layer 610 are etched to form a circuit as shown in FIG. 7 according to an embodiment of the present invention. The etched portions of the landing pad material 700, 702 and the second thin film resistor layer 706, 708 form etch-stop contacts for the first thin film resistor 712. Another etched portion of the second thin film resistor layer form a second thin film resistor 710. Furthermore, another etched portion of the landing pad material 704 serves to provide contacts to the second thin film resistor 710 after subsequent masking and etch steps that are discussed below. In some embodiments, the first and second thin film resistors may be comprised of different materials. In other embodiments, the first and second thin film resistors may be comprised of same material.

Figure 8:
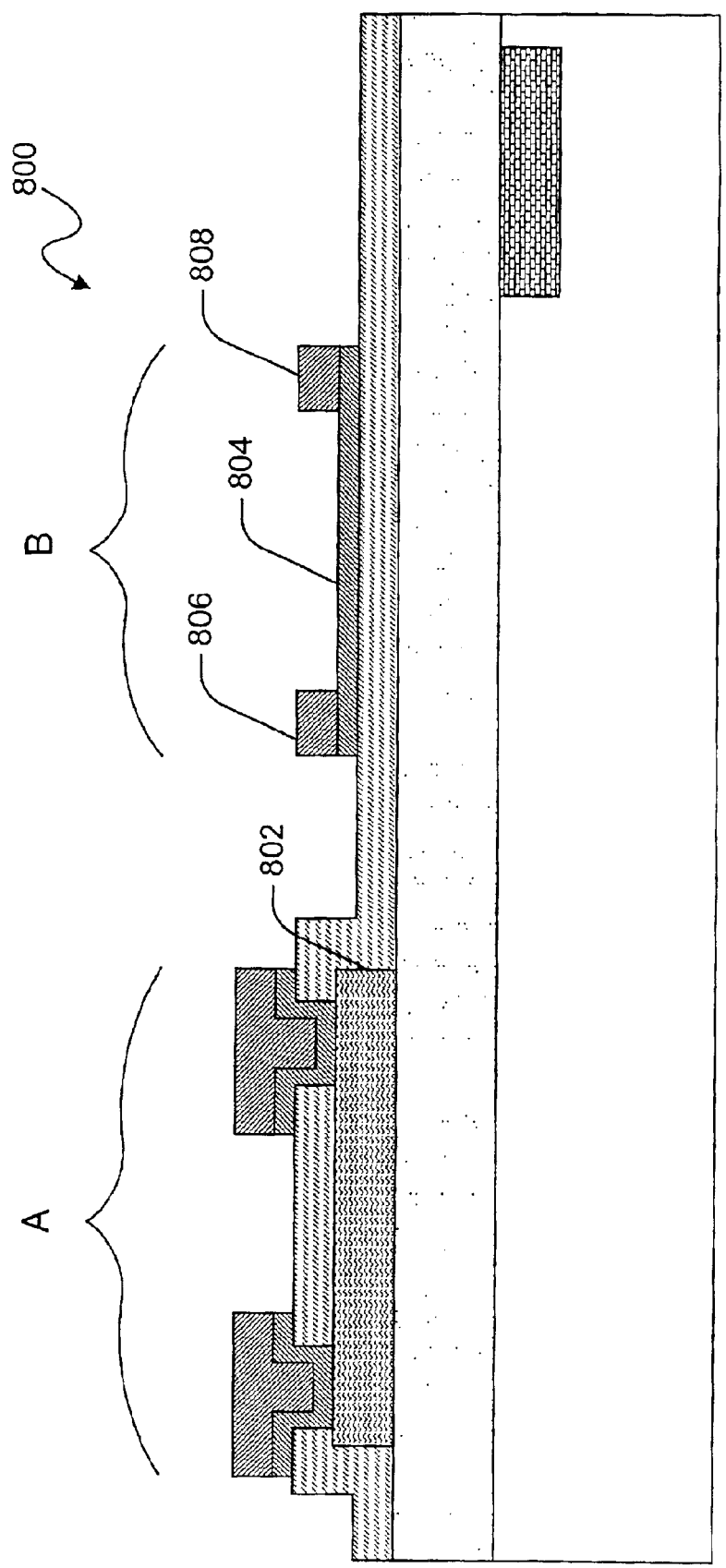

An integrated circuit 800 including the first and second thin film resistors 802, 804, respectively, is illustrated in FIG. 8 according to an embodiment of the present invention. The first thin film resistor 802 is formed over an area A, while the second thin film resistor 804 is formed over an area B. In the illustrated embodiment, the landing pad material over the second thin film resistor 804 is selectively etched to expose the resistor 804. The etched landing pads 806, 808 may form etch-stop contacts to the second thin film resistor 804.

Figure 9:
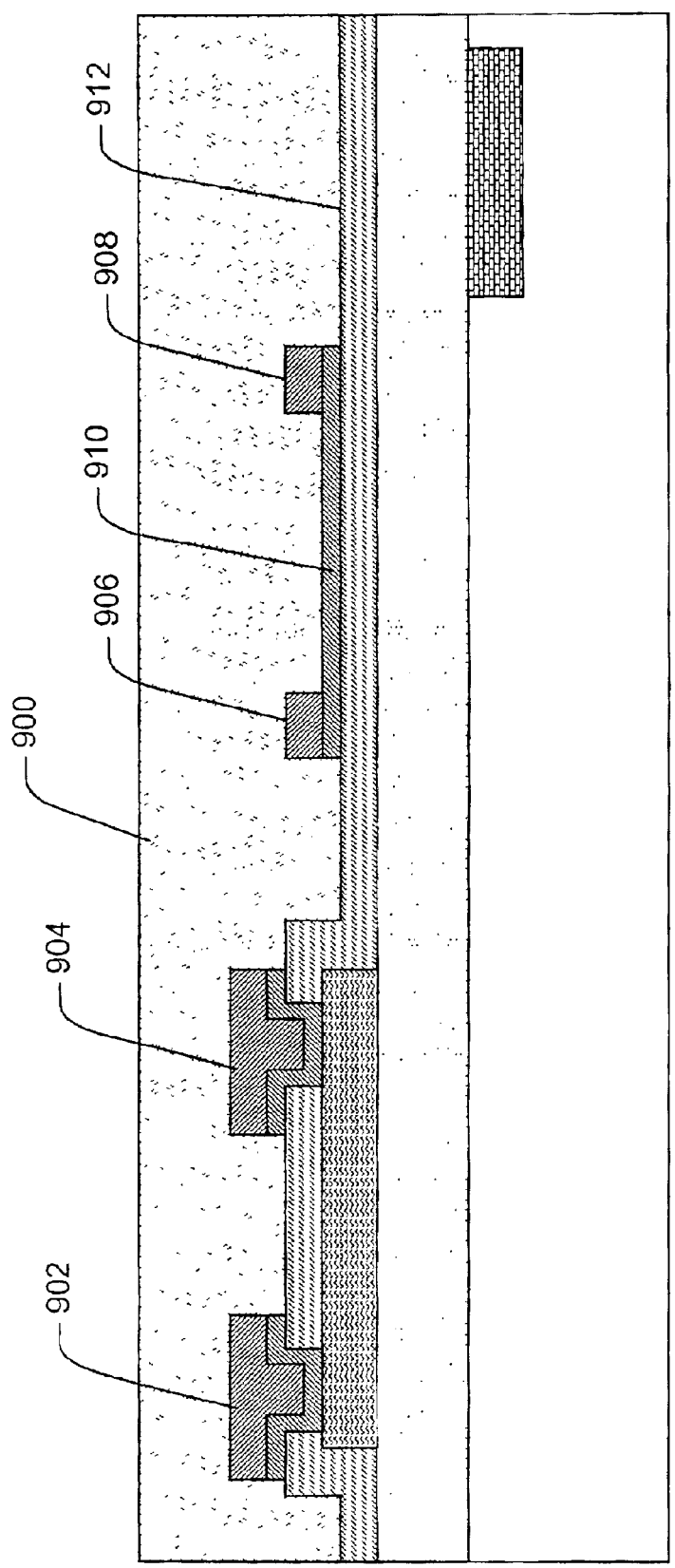

FIG. 9 shows another dielectric layer 900 deposited over the etch-stop contacts 902, 904, 906, 908, the exposed portions of the second thin film resistor 910, and the exposed portions of the previous dielectric layer 912. After 1the dielectric layer 900 has been deposited, the layer 900 may be polished to achieve a desired planarization for its top surface and a desired thickness.

Figure 10:
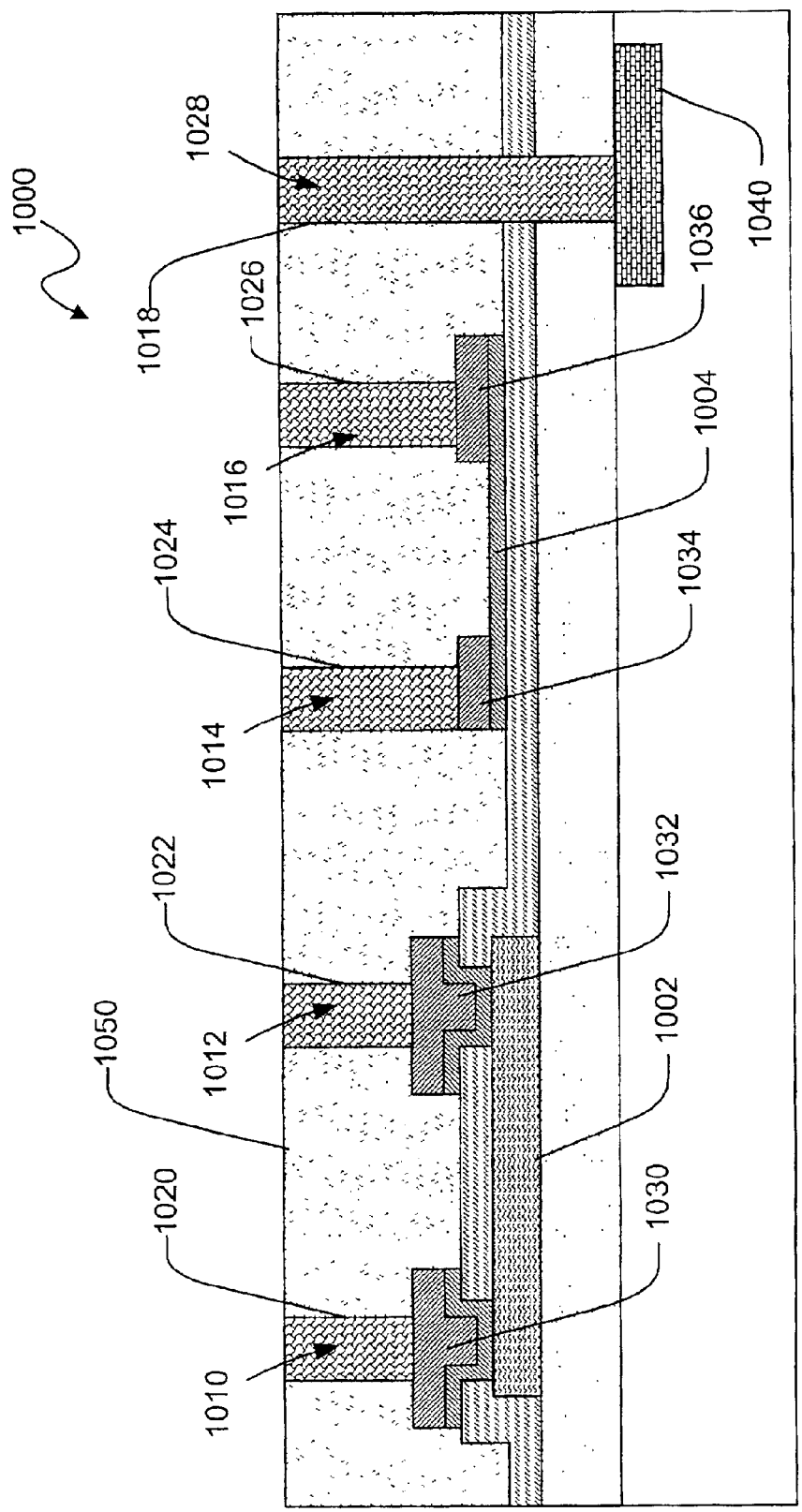

An exemplary integrated circuit 1000, at another subsequent stage of forming multiple thin film resistors 1002, 1004, is illustrated in FIG. 10. At this stage, contact openings 1010–1016 are formed through the dielectric layer 1050 to expose the underlying etch-stop contacts 1030–1036. Metal plugs 1020–1026 are formed within the contact openings 1010–1016 of the dielectric layer 1050 to provide contacts for the first and second thin film resistors 1002, 1004, respectively. Other openings (e.g., 1018) and plugs (e.g., 1028) may be formed to provide deep contacts to active devices (e.g., 1040).

There has been disclosed herein embodiments for providing efficient thin film resistor manufacturing process to enable reduction in the number of masking operations. In particular, the production may be achieved by using a single landing pad to provide contacts to more than one thin film resistor. This scheme may enable improved contact resistor to the thin film resistor (i.e., less variability of contact resistance across wafer). Moreover, this scheme enables imposition of substantially identical heat treatment of multiple resistors.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. For example, although the method is described in a specific sequence, the sequence may be modified without substantially changing the outcome. In other instances, well-known structures and functions were not described in elaborate detail in order to avoid obscuring the subject matter of the present invention. Accordingly, the scope and spirit of the invention should be judged in terms of the claims which follow.

What is claimed is:

1. A method for forming multiple resistors on a substrate, comprising:
    first providing a first resistor;
    first depositing, patterning, and selectively etching a first dielectric layer over the first resistor;
    second providing second resistor material over the first dielectric layer;
    third providing landing pad material over the second resistor material; and
    selectively etching said landing pad material and said second resistor material, where said selectively etching forms contacts for the first resistor in a first region, and forms a second resistor and associated contacts in a second region.

2. The method of claim 1, wherein said first providing includes providing chromium silicon (CrSi) material.

3. The method of claim 1, wherein said first providing includes providing nickel chromium (NiCr) material.

4. The method of claim 1, wherein said first providing includes providing a silicon substrate.

5. The method of claim 1, wherein said second providing includes providing nickel chromium (NiCr) material.

6. The method of claim 1, wherein said third providing said landing pad material includes providing titanium-nitride (TiN).

7. The method of claim 1, wherein said third providing said landing pad material includes providing titanium-tungsten (TiW).

8. The method of claim 1, wherein said first providing a first resistor includes providing a substrate.

9. The method of claim 8, wherein said first providing a first resistor includes depositing a second dielectric layer on top of the substrate.

10. The method of claim 9, wherein said first providing a first resistor includes depositing, patterning, and selectively etching a fist resistor material on top of the second dielectric layer.

11. The method of claim 1, further comprising:
    second depositing a second dielectric layer on said contacts for the first resistor, exposed portions of said second resistor, and exposed portions of said first dielectric layer.

12. The method of claim 11, further comprising:
    appropriately repeating said first providing, said first depositing, said second providing, said third providing, said selectively etching, and said second depositing.

13. A method for forming a plurality of thin film resistors, comprising:
    forming a first thin film resistor;
    depositing and selectively etching a dielectric layer to provide contact openings in the dielectric layer for the first thin film resistor;
    depositing a layer of second thin film resistor material;
    depositing a layer of landing pad material;
    patterning and selectively etching the landing pad material and the layer of second thin film resistor material to provide contacts to the first thin film resistor in the contact openings and to form a second thin film resistor in an area away from the contact openings; and
    selectively etching the landing pad material above the second thin film resistor to expose the second thin film resistor, and to provide contacts for the second thin film resistor.

14. The method of claim 13, further comprising:
    appropriately repeating said forming, said depositing, said patterning, said first selectively etching, and said second selectively etching, to form additional thin film resistors.

15. A method for forming a plurality of thin film resistors, comprising:
    first providing a substrate;
    first depositing a first dielectric layer on the substrate;
    second depositing a first thin film resistor material on the first dielectric layer;
    first patterning and selectively etching the thin film resistor material to form a first thin film resistor;
    third depositing a second dielectric layer over the first thin film resistor and over the exposed portion of the first dielectric layer;
    etching the second dielectric layer over portions of the first thin film resistor to provide contact openings for the first thin film resistor;
    fourth depositing second thin film resistor material over portions of the first thin film resistor underlying the contact openings and over the second dielectric layer;
    fifth depositing landing pad material over the second thin film resistor material;
    second patterning and selectively etching the landing pad material and the second thin film resistor material over the contact openings to provide etch-stop contacts for the first thin film resistor,
    third patterning and selectively etching the landing pad material and the second thin film resistor material at an area away from the first thin film resistor to form a second thin film resistor;
    selectively etching the landing pad material on the second thin film resistor to expose the second thin film resistor, and to provide contacts to the second thin film resistor with remaining portions of the landing pad material;
    sixth depositing a third dielectric layer over the etched landing pad material, exposed portion of the second thin film resistor, and exposed portion of the second dielectric layer; and second providing shallow contacts to the first and second thin firm resistor.

16. The method of claim 15, wherein said providing a substrate includes providing a silicon substrate.

* * * * *